US005740429A

United States Patent [19]
Wang et al.

[11] Patent Number: 5,740,429
[45] Date of Patent: Apr. 14, 1998

[54] E10 REPORTING TOOL

[75] Inventors: Qingsu Wang; John Zvonar; Mike Simpson, all of Austin, Tex.

[73] Assignee: Advanced Micro Devices, Inc., Sunnyvale, Calif.

[21] Appl. No.: 499,220

[22] Filed: Jul. 7, 1995

[51] Int. Cl.$^6$ .................................... G06F 17/30
[52] U.S. Cl. .................... 395/615; 395/180; 364/480
[58] Field of Search ................. 395/615, 180; 364/480

[56] References Cited

U.S. PATENT DOCUMENTS

| | | | |
|---|---|---|---|
| 5,295,242 | 3/1994 | Mashruwala | 395/356 |
| 5,367,624 | 11/1994 | Cooper | 395/357 |

OTHER PUBLICATIONS

Rampalli et al., "CEPT—A Computer–Aided Manufacturing Application for Managing Equipment Reliability and Availability in the Semiconductor Industry", IEEE Transactions on Components, Hybrids, and Manufacturing Technology, vol. 14, No. 3, Sep., 1991.

Richard H. McFadden, "Developing a Data Base for a Reliability, Availability, and Maintainability (RAM) Improvement Program for an Industrial Plant or Commercial Building", Conference Record. Industrial & Commercial Power Systems Technical Conference May 1989.

*Primary Examiner*—Paul R. Lintz
*Attorney, Agent, or Firm*—Merchant, Gould, Smith, Edell, Welter & Schmidt, P.A.

[57] ABSTRACT

Method and system for automatically and accurately generating E10 reports based on a user-selected set of parameters, including date range, equipment and other parameters, are disclosed. In a preferred embodiment, the system of the present invention performs three primary functions; namely, a mapping function, a data extraction function and a reporting application function. The mapping function enables users to map WorkStream events into E10 defined states outside of the WorkStream database. The reporting application function provides several major functional capabilities, particularly, enabling a user to formulate restriction information, or "E10 data requests," for data extraction and reporting purposes. Each E10 data request identifies, as a function of facility (or manufacturing area), module, family and/or equipment, the equipment list for which data is to be accumulated, as well as a time period for reporting and duration type to report on. In addition, the reporting application function enables the user to display all E10 calculations for each piece of equipment in the extracted data set and to generate and display via a video terminal, printer and/or plotter, standard and custom graphic reports from the extracted E10 data calculations. The data extraction function provides the necessary data extraction capabilities and E10 data request management by managing and executing the requests submitted by users and purging old requests from the queue. In one aspect of the invention, the system comprises a user interface for facilitating the user's formulation of requests, mapping of WorkStream events to E10 states and substates, and viewing and/or printing reports in textual and graphical formats.

33 Claims, 14 Drawing Sheets

FIG. 3

```
SEA Reporting System-(RepSEA)
           Main Menu

1.  Standard RepSEA Graphics
    2.  Standard RepSEA Reports
    3.  Event Mapping Report
    4.  Map Events
    5.  Update Printer/Plotter Queue Lists
    6.  E10 Graphics
    7.  Pareto By Folder
    8.  Exit Enter your choice:  [8]

Application: REPSEA      Menu: REPSEA           <USC><DBG>     <Rep>
```

FIG. 4

Manufacturing Area Name: [FAB15]  Only show events without E10 mapping? [N]

| EVENTS %REP% | E10 Mapping | E10 Mapping - Categorizations |
|---|---|---|
| DOWN TO REP ← <br> ENG REPAIR <br> MNT REPAIR <br> PRC REPAIR <br> REP LOGOFF <br> REP LOGON <br> REP REPAIR <br> REPAIR/PM <br> REPAIR/PRC <br> REPAIR/RUN | RepSEA <br> Standard <br> Mapping <br><br> QUEUE | Other Mappings |

Press (TAB) to enter mappings. (DOWN/UP) to move. (PREV SCREEN) to re-query
Count •10                                                      <Replace>

FIG. 5

```
┌─────────────── Event Mapping Report ───────────────┐
│ Create Report in Batch Mode? [N]   Report Filename [    ] │
│ Printer: [         ]                                       │   500
├────────────────────────────────────────────────────┤
│ Sorted By:      Facility, Event, Mapping  [X]      │
│                 Mapping, Facility, Event           │   502
├────────────────────────────────────────────────────┤
│ Show Event Mappings for:         Facility: [FAB15] │
│                              Mapping Type: [ALL]   │
│        ┌─────────── HELP ───────────────┐          │   504
│        │ PRESS [DO/COMMIT] TO CREATE REPORT │      │
│        │ PRESS CONTROL-K FOR LIST OF KEYS...│      │
│        └──────────────────────────────────┘        │
└────────────────────────────────────────────────────┘
│ Completed report generation.                        │
│ Count: *0                             <Replace>    │
```

FIG. 6

```
                Event Mappings Reported By Area
                   FAB15 - All Mapping Types
Page 1     of 1

Manufacturing Area:  FAB15

Event Name     Type         Mapping      Description
-----------    ---------    ----------   ----------------------------------
AWAIT PARTS    REPSEA_STD   QUEUE        Waiting for maintenance
COMMENTS       E10          NO E10 CAT   No E10 sea_category for this event (CO
               REPSEA_STD   NO CHANGE    Use Categorization of previous event f
DOWN TO ENG    REPSEA_STD   QUEUE        Waiting for maintenance
DOWN TO MNT    REPSEA_STD   QUEUE        Waiting for maintenance
DOWN TO REP    E10          NO E10 CAT   No E10 sea_category for this event (CO
               REPSEA_STD   QUEUE        Waiting for maintenance
ENG LOGOFF     REPSEA_STD   QUEUE        Waiting for maintenance
ENG LOGON      REPSEA_STD   ACTIVE       Active maintenance performed
ENG REPAIR     REPSEA_STD   END EPISODE  This event ends an episode.
MNT LOGOFF     REPSEA_STD   QUEUE        Waiting for maintenance
MNT LOGON      REPSEA_STD   ACTIVE       Active maintenance performed
MNT REPAIR     REPSEA_STD   END EPISODE  This event ends an episode.
PARTS RECVD    REPSEA_STD   ACTIVE       Active maintenance performed
```

FIG. 7

```
                Event Mappings Reported By Mapping
                    FAB15 - All Mapping Types
Page 1    of 1

E10         Mapping: NO E10 CAT   Desc: No E10 sea_category for this event (CO

Manufacturing Area      Event Name
    ------------------      ----------
    FAB15                   COMMENTS
    FAB15                   DOWN TO REP
    FAB15                   REP LOGOFF REPSEA_STD Mapping: ACTIVE      Desc: Active maintenance performed Manufacturing Area      Event Name
    ------------------      ----------
    FAB15                   ENG LOGON
    FAB15                   MNT LOGON
    FAB15                   PARTS RECVD
    FAB15                   REP LOGON
```

FIG. 8

```
                RepSEA Reporting System
                   E10 Reporting Menu 1. Data Extraction Request
            2. Monitor / Report Request
            3. E10 Calc Detail Report
            4. Return to Main Menu
            5. Exit System Enter your choice.  [        ]

Application: REPSEA    Menu: REPSEA       <USC><DBG>   <Rep>
```

FIG. 9

```
┌──────────────── Submit request for E10 Calculations ────────────────┐
│   "M"apping or "S"tatus Standard:  [M]                              │
│   "A"verage or "T"rend calculations: [A]                            │
│            Date Range - From: [11/01/94] :00:00:00 To [12/01/94] :00:00:00 │
│                         Site: [AUSTIN  ]                            │
│            Manufacturing Area: [FAB14 ]                             │
│                       Module: [THIN FILMS]                          │
│             Equipment Family: [       ]                             │
│                 Equipment Id: [       ]                             │
│                                                                     │
│   ┌─────────────────────────────────────────────────────────────┐   │
│   │ Press [DO / COMMIT] to submit request to the database.      │   │
│   │ Press [CTRL-K] for help screen.                             │   │
│   └─────────────────────────────────────────────────────────────┘   │
└─────────────────────────────────────────────────────────────────────┘
 Enter an equipment module to select data for.  Use [FIND/LIST] for select.
 Count: *0                                                 <List> <Replace>
```

FIG. 10

```
┌──────────────────────── MONITOR E10 REQUESTS ────────────────────────┐
│ Request Request  Mfg.           Eqpt              Date Range  Request│
│   Id    Status   Area  Module  Family  Equip Id   From    To  Made By│
│ ─────── ──────── ───── ─────── ─────── ──────── ──────── ──────── ───│
│   421  WORKING   FAB14 THIN FIL                  11/01/94 12/01/94 REPSEA│
│   382  COMPLETED FAB14 DIFFUSIO                  06/20/94 08/07/94 REPSEA│
│   414  COMPLETED FAB14         AME               09/26/94 11/06/94 REPSEA│
│   413  COMPLETED FAB14         AME               10/01/94 11/01/94 REPSEA│
│   362  COMPLETED FAB14 DIFFUSIO TEMPRESS FURN A1 06/26/94 08/06/94 T64296│
│   346  COMPLETED FAB14 DIFFUSIO TEMPRESS FURN A1 07/03/94 07/30/94 T64296│
│   390  COMPLETED FAB14 DIFFUSIO TEMPRESS FURN A1 07/04/94 08/07/94 T64296│
│   345  COMPLETED FAB14 DIFFUSIO TEMPRESS FURNA1  07/03/94 07/30/94 T64296│
│   363  COMPLETED FAB14 DIFFUSIO TEMPRESS         06/26/94 08/06/94 T64296│
│   376  COMPLETED FAB14 DIFFUSIO TEMPRESS         09/26/94 10/24/94 T08936│
├──────────────────────────── DETAILS ─────────────────────────────────┤
│ Request Id: [421    ] Requested By [REPSEA         ] on [12/13/94]   │
│ Standard Used: [MAPPED] Duration Type: [AVERAGED] Report Site: [AUSTIN]│
├────────────────────────────── HELP ──────────────────────────────────┤
│ Press [PAGE DOWN / NEXT BLOCK] to view reports for the E10 request.  │
│ Press [F12 / EXECUTE QUERY] to refresh. Press [CTRL-K] for more help.│
│ Press [DO / COMMIT] to print text report of all calculations for request.│
└──────────────────────────────────────────────────────────────────────┘
 Press [PAGE DOWN / NEXT BLOCK] to view reports defined for this request.
 Count: 10    v                                                <Replace>
```

1000 — (upper section)
1002 — (lower section)

FIG. 11

```
                    ─── MONITOR E10 REQUESTS ───
  Request  Request   Mfg.              Eqpt                    Date Range        Request
    Id     Status    Area   Module    Family    Equip Id      From      To       Made By
   ┌──────────────────────────────────────────────────────────────────────────────────────┐
    421   WORKING   FAB14  THIN FIL                           11/01/94  12/01/94  REPSEA
    382   COMPLETED FAB14  DIFFUSIO                           06/20/94  08/07/94  REPSEA
    414   COMPLETED FAB14            AME                      09/26/94  11/06/94  REPSEA
    413   COMPLETED FAB14            AME                      10/01/94  11/01/94  REPSEA
    362   COMPLETED FAB14  DIFFUSIO  TEMPRESS  FURN A1        06/26/94  08/06/94  T64296
    346   COMPLETED FAB14  DIFFUSIO  TEMPRESS  FURN A1        07/03/94  07/30/94  T64296
    390   COMPLETED FAB14  DIFFUSIO  TEMPRESS  FURN A1        07/04/94  08/07/94  T64296
    345   COMPLETED FAB14  DIFFUSIO  TEMPRESS  FURNA1         07/03/94  07/30/94  T64296
    363   COMPLETED FAB14  DIFFUSIO  TEMPRESS                 06/26/94  08/06/94  T64296
    376   COMPLETED FAB14  DIFFUSIO  TEMPRESS                 09/26/94  10/24/94  T08936

─── DETAILS ───                                                  ─1100
                         Output Parameters ─── Press (DO/COMMIT) To Output  GRAPH REPORT ───
    Create Reports in Batch Mode? [N]      Report Filename: [        ]
    Printer: [P141PS_PS]     Plotter: [P141PS_PS]    Save as default? [N]

Enter the name of the print queue to send the report to. Use (FIND/LIST).
   Count: *0                                                  <List><Replace>
```

FIG. 12A

```
  Area: FAB14    Module:              Family: AME    Eqpt:
       E10 Request Sk:      426

Entity:   AME
          Time Period:   1001-1008
          Failures Cnt                                        6
   Machine Failures Cnt                                       0
     Equipment Cycles                                       200
           Assist Cnt                                         0
      Equipment Uptime                                2141666.0000
    Equipment Downtime                                 453167.0000
          Repair Time                                  249172.0000
      Operations Time                                 2594833.0000
  Down Time Incident Cnt                                      6
  Maintenance Delay Time                              110695.0000
  User Maint Delay Time                                29091.0000
   Spec Input Downtime                                      0.0000
           Total Time                                 3024000.0000

Buffer: E10_CALC_REPORT.RP1               Write | Insert | Forward
  Executing commands in initialization file:  CAM_MED:[JBLACKWELL]EDTINI.TPU:1
```

FIG. 12B

| | |
|---|---:|
| Total Time | 3024000.0000 |
| Facility Downtime | 0.0000 |
| Qual Time | 93300.0000 |
| Unscheduled Downtime | 303509.0000 |
| Scheduled Downtime | 149658.0000 |
| Productive Time | 1916274.0000 |
| Standby | 225392.0000 |
| Engineering | 0.0000 |
| Non Scheduled | 429167.0000 |

| Calculation: | | Value: | |
|---|---|---|---:|
| Calculation: | MTBFp | Value: | 88.7164 |
| Calculation: | MTBFm | Value: | 88.7164 |
| Calculation: | MTBAp | Value: | 532.2983 |
| Calculation: | MTTR | Value: | 11.5357 |
| Calculation: | MTOL | Value: | 20.9800 |
| Calculation: | MCBF | Value: | 33.3333 |
| Calculation: | MCBA | Value: | 200.0000 |
| Calculation: | EDUT | Value: | 86.2136 |
| Calculation: | SDUT | Value: | 83.4716 |
| Calculation: | OPUPT | Value: | 82.5358 |

Buffer: E10_CALC_REPORT.RP1    Write | Insert | Forward

Executing commands in initialization file: CAM_MED:[JBLACKWELL]EDTINI.TPU:1

FIG. 12C

| Calculation: | | Value: | |
|---|---|---|---:|
| Calculation: | MCBF | Value: | 33.3333 |
| Calculation: | MCBA | Value: | 200.0000 |
| Calculation: | EDUT | Value: | 86.2136 |
| Calculation: | SDUT | Value: | 83.4716 |
| Calculation: | OPUPT | Value: | 82.5358 |
| Calculation: | OPUT | Value: | 73.8496 |
| Calculation: | TOUT | Value: | 63.3688 |
| Calculation: | EQUC | Value: | 85.0143 |
| Calculation: | PRUC | Value: | 81.9290 |
| Calculation: | Assists | Value: | 0.0000 |
| Calculation: | Failures | Value: | 6.0000 |
| Calculation: | Non-Machine Failures | Value: | 0.0000 |
| Calculation: | Equipment Cycles | Value: | 200.0000 |
| Calculation: | Downtime Incidents | Value: | 6.0000 |
| Calculation: | Unscheduled Downtime | Value: | 303509.0000 |
| Calculation: | Scheduled Downtime | Value: | 149658.0000 |
| Calculation: | Productive Time | Value: | 1916274.0000 |
| Calculation: | Standby | Value: | 225392.0000 |
| Calculation: | Engineering | Value: | 0.0000 |
| Calculation: | Non-Scheduled | Value: | 429167.0000 |
| Calculation: | Standby No WIP | Value: | 0.0000 |

Buffer: E10_CALC_REPORT.RP1    Write | Insert | Forward

Executing commands in initialization file: CAM_MED:[JBLACKWELL]EDTINI.TPU:1

FIG. 13

Reports For E10 Request 426

| X | Report Title | Calc Status |
|---|---|---|
| X | EQUIPMENT – MIBAp vs. MCBA | COMPLETED |
| X | EQUIPMENT – TOUT vs. OPUT | COMPLETED |
| X | EQUIPMENT – EQUC vs. PRUC | COMPLETED |
| X | EQUIPMENT – OPUPT | COMPLETED |
| X | EQUIPMENT – EDUT vs. SDUT | COMPLETED |
|   | FAMILY – Equipment Time | COMPLETED |
| X | FAMILY – MTBFp vs. MCBF | COMPLETED |
| X | FAMILY – MTOL vs. MTTR | COMPLETED |
|   | FAMILY – MTBFp vs. MTBFm | COMPLETED |

1300, 1302

DETAILS / CALCULATIONS

Mfg Area: FAB14   Time Level: ENTIRE TIME    | Y1 | MIBAp |
Module:           Entity Level: EQUIPMENT    | Y2 | MCBA  |
Family: AME       Report Type: BAR GRAPH
Equipment:

1304

HELP
Press [DO / COMMIT] to print marked reports. Press [CTRL-K] for more help.
Press [INSERT / CREATE RECORD] to enter a custom report request.
Press [F12 / EXECUTE QUERY] to refresh list with most current statuses.

Mark with an "X" to select report for printing. Leave blank to not print report.

Count: 19    ^ v                                              <Replace>

FIG. 14

Reports For E10 Request 382

| X | Report Title | Calc Status |
|---|---|---|
|   | EQUIPMENT – Equipment Time | COMPLETED |
| X | EQUIPMENT – MTBFp vs. MCBF | COMPLETED |
| X | EQUIPMENT – MTOL vs. MTTR | COMPLETED |
| X | EQUIPMENT – MTBFp vs. MTBFm | COMPLETED |
|   | EQUIPMENT – MTBAp vs. MCBA | COMPLETED |
| X | EQUIPMENT – TOUT vs. OPUT | COMPLETED |
| X | EQUIPMENT – EQUC vs. PRUC | COMPLETED |
| X | EQUIPMENT – OPUPT | COMPLETED |
| X | EQUIPMENT – EDUT vs. SDUT | COMPLETED |

DETAILS

Output Parameters

Press [DO/COMMIT] To Output  GRAPH REPORT
Create Reports in Batch Mode? N        Report Filename:
Printer: P141PS_PS    Plotter: P141PS_PS    Save as default? N

1400

Enter the name of the print queue to send the report to. Use [FIND/LIST].

Count: *0                                          <List><Replace>

FIG. 17A

```
┌─────────────────────────────────────────────────────────────────────┐
│  ┌─────────── Print Report For E10 Data Request ─────────────────┐  │
│  │ Report Type  [2]    [BAR GRAPH]                                │  │
│  │ Group at Entity Level  [EQUIPMENT]      Time Level  [WEEKLY]   │  │
│  │ Area [FAB14]  Module  [DIFFUSION]   Family [TEMPRESS]  Eqpt[ ] │  │
│  │ Report Title    [Test Title For Documentation]                 │  │
│  │ X Axis Label    [X Axis Label] 1702a              1702b        │  │
│  │ ┌── Calculations on Y1 Axis ──┐  ┌── Calculations on Y2 Axis ─┐│  │
│  │ │ Label: [Y1 Label]           │  │ Label: [Y2 Label]           ││  │
│  │ │ Units: [Hours]              │  │ Units: [%]                  ││  │
│  │ │ [MTBFp] Mean (Productive) D │  │ [TOUT]  Equipment Dependent ││  │
│  │ │ [MTBFm] Mean Time Between Ma│  │ [SDUT]  Supplier Dependent U││  │
│  │ │ [MTBAp] Mean (Productive) Ti│  │ [OPUPT] Operational Uptime  ││  │
│  │ │ [MTTR]  Mean Time To Repair │  │ [OPUT]  Operational Utiliz. ││  │
│  │ │ [MTOL]  Mean Time Off Line  │  │ [TOUT]  Total Utilization   ││  │
│  │ └─────────────────────────────┘  └─────────────────────────────┘│  │
│  │ ──────────────────────── HELP ─────────────────────────────────│  │
│  │ Press [DO / COMMIT] to save custom report. Press [CTRL-K] for help screen. │
│  │ May mark one or more calculation on Y1 axis or one each on Y1 and Y2 axis.│
│  └────────────────────────────────────────────────────────────────┘  │
│  ┌────────────────────────────────────────────────────────────────┐  │
│  └────────────────────────────────────────────────────────────────┘  │
│  Count: *0                                          <Replace>        │
└─────────────────────────────────────────────────────────────────────┘
```

1700 encompasses the above dialog.

FIG. 17B

| Calculation | Formula |
|---|---|
| MTBFp | Productive time / # of failures |
| MTBFm | Productive time / (# of failures − # of non-machine failures) |
| MTBAp | Productive time / # of assists |
| MTTR | Total repair time / # of failure |
| MTOL | Total equipment downtime / # of downtime incidents |
| MCBF | total equipment cycles / # of failures |
| MCBA | total equipment cycles / # of assists |
| EDUT | equipment uptime / (operations time − (all maint delay + out of spec + facil related DT) * 100 |
| SDUT | equipment uptime / (operations time − (user maint delay + ou |

Buffer: E10_CALC_DESC_REPORT.RP1      Write | Insert | Forward

Executing commands in initialization file: CAM_MED: [JBLACKWELL]EDTINI.TPU;1

E10 REPORTING TOOL

TECHNICAL FIELD

The invention relates generally to measurement of the reliability, availability and maintainability ("RAM") of integrated circuit ("IC") fabrication equipment and, more particularly, to a system for automatically tracking and reporting on the performance, or RAM, of such equipment, using the SEMI-defined E10-9X standard.

BACKGROUND OF THE INVENTION

Reliability, availability, and maintainability ("RAM") are measures of equipment performance that have been widely used in the integrated circuit ("IC") fabrication industry for decades. In particular, reliability refers to the probability that a piece of equipment will perform its intended function within stated conditions for a specified period of time. Availability refers to the probability that the equipment will be retained in or restored to a condition where it can perform its intended function within a specified period of time. Maintainability refers to the probability that the equipment will be retained in, or restored to a condition where it can perform its intended function within a specified period of time.

The International Standards Program is one of the key association services offered by a group known as Semiconductor Equipment and Materials International ("SEMI") to the worldwide semiconductor industry. Representing both IC device manufacturers ("users") and equipment and materials manufacturers ("suppliers") located on several continents, SEMI began its standards program as a service to United States members and has since expanded internationally. In the context of SEMI, "standards" are voluntary, technical agreements among suppliers and users and are aimed at providing compatibility and interoperability of goods and services. In other words, standards are intended to improve product quality and reliability at a reasonable price.

A SEMI standards "product" can be a written specification, a guideline, a test method, terminology, an education program or an industry white paper. The most familiar "products" of the SEMI Standards program are documents published in SEMI International Standards books. In this regard, one of the most notable SEMI standards products is the SEMI E10-92 Guideline for Definition and Measurement of Equipment Reliability, Availability, and Maintainability (RAM), hereinafter referred to as the "E10 Standard" and incorporated by reference in its entirety. The primary goal of the E10 Standard is to establish guidelines for measuring equipment performance in an IC fabrication, or "fab," facility.

The E10 Standard provides a basis of communication between users and suppliers in the industry, as well as a common standard for users to measure the performance of their equipment. The E10 Standard defines six basic equipment states into which all equipment conditions and periods of time must be categorized. The measurement of equipment RAM concentrates on the relationship of equipment failures to equipment usage, rather than the relationship of failures to total elapsed time. In this regard, productive times and equipment cycles are considered the indicators of equipment usage. Clearly, effective application of the E10 Standard requires that users track equipment performance, or RAM, accurately and diligently.

The six basic equipment states defined by the E10 Standard include a "productive state," a "standby state," an "engineering state," a "scheduled downtime state," an "unscheduled downtime state," and a "nonscheduled state." Productive state designates a period of time during which the equipment is performing its intended function and includes regular production, including product loading and unloading, work for third parties, rework, production tests and engineering runs performed in conjunction with production. Standby state designates a period of time, other than nonscheduled time, during which the equipment is in a condition to perform its intended function, but is not operated, and includes such equipment states as no operator available, no product available, no support tools, awaiting results of production tests. Engineering state designates a period of time during which the equipment is in a condition to perform its intended function, but is instead operated to conduct engineering experiments and includes process engineering and equipment engineering. Scheduled downtime state designates a period of time during which the equipment is not available to perform its intended function due to planned downtime events, such as scheduled maintenance. Unscheduled downtime state designates a period of time during which the equipment is not in a condition to perform its intended functions due to unplanned downtime events, such as unscheduled maintenance. Finally, nonscheduled state designates a period of time during which the equipment is not scheduled to be utilized in production, such as unworked shifts, weekends and holidays, including shut-down and start-up.

The various amounts of time each piece of equipment spends in the above-mentioned states are used to compute a variety of different measurements, or metrics, which in turn are used as an objective measure of the RAM of the equipment. Equipment performance reporting, via E10 metrics, is an important instrument in enabling fab technicians, engineers and managers to understand the overall effectiveness of their tools, and to communicate this information to their suppliers.

In many fabs, equipment users generate their equipment reports using different methods, such as CAM-developed tools, user-developed tools, or manual extraction and calculation, to determine various RAM metrics defined by the E10 Standard. One deficiency inherent in such methods is that, more often than not, they result in inconsistent E10 reports for any given tool set across the entire fabrication facility. This inconsistency results in confusion and mixed signals for the supplier community. To a large extent, for the existing equipment reporting tools, there has been no strict control over the equipment event model and states. In addition, the equipment states may vary from area-to-area and fab-to-fab of a single IC manufacturer to comply with individual fab business rules. Moreover, interpretation of the E10 definitions has been inconsistent from person-to-person. Thus, none of the existing E10 reports are guaranteed to be accurate. The existing E10 reporting methods listed above are also obsolete at differing levels, due to their failure to keep current with the E10-9X model changes.

Therefore, what is needed is a system that enables the standard, automatic, accurate and consistent generation of equipment performance reports based on the E10 Standard metrics.

SUMMARY OF THE INVENTION

The present invention, accordingly, provides a method and a system for automatically and accurately generating E10 reports based on a given set of parameters that overcome or reduce disadvantages and limitations associated with prior methods and systems, particularly with respect to manual E10 reporting methods.

In a preferred embodiment, the system of the present invention performs three primary functions; namely, a mapping function, a data extraction function and a reporting application function. The mapping function enables users to map WorkStream events into E10 defined states outside of the WorkStream system. The reporting application function provides several major functional capabilities, the most notable of which is enabling a user to formulate restriction information, or "E10 data requests," for data extraction and reporting purposes. Each E10 data request identifies, as a function of facility (or manufacturing area), module, family and/or equipment, the equipment list for which data is to be accumulated, as well as a time period for reporting and duration type to report on. In addition, the reporting application function enables the user to display all E10 calculations for each piece of equipment in the extracted data set and to generate and display via a video terminal ("VT"), printer and/or plotter, standard and custom graphic reports from the extracted E10 data calculations. The data extraction function provides the necessary data extraction capabilities and E10 data request management by managing and executing the requests submitted by users and purging old requests from the queue.

In one aspect of the invention, the system comprises a user interface for assisting the user in formulating requests, mapping WorkStream events to E10 states and substates, and viewing and/or printing reports in textual and graphical formats. In particular, selection of a "Map Events" option from a main menu screen enables the user to view events by facility and to specify mappings for various WorkStream events. Event mapping is used to classify events into groups of related events, as well as to categorize the time of an event for E10 reporting purposes Proper use of these E10 mappings will allow the time and failure counts associated with each WorkStream event to be reported properly. Each event may be associated with one or more E10 reporting categories.

Selection of an "Event Mapping Report" option from the main menu screen results in the display of all currently defined event mappings, thereby enabling a user to determine to what E10 states particular WorkStream events are currently being mapped.

Selection of an "E10 Graphics" option from the main menu brings up an E10 Reporting menu screen that provides access to the E10 reporting functions, which functions include the preparation of E10 data requests to be submitted for processing, monitoring the state of submitted data requests, defining custom E10 reports for any data extraction, generating and displaying one or more standard E10 reports, generating and displaying one or more custom E10 reports, displaying the values of all E10 calculations of any completed data extraction, and displaying a description of all E10 calculations.

In another aspect of the invention, once a submitted E10 data request has been completely processed, the resulting calculations can be viewed, printed and/or plotted in textual and/or graphical formats, as specified by the user. Moreover, the user can generate standard graphical reports by selecting a standard format from a list of available formats, or can generate custom reports by entering desired parameters for the report using a Custom Report Request Entry screen of the system of the present invention.

In another aspect of the invention, an E10 Calculations for Request Report screen can be accessed to display all possible E10 calculations by name, and the value for every piece of equipment that meets the criteria specified in the corresponding E10 data request.

In yet another aspect of the invention, an E10 Calc Details Report screen can be accessed to display a list of the E10 calculations and the formulas used to calculate each of them.

In operation, once an E10 data request has been submitted, the request will be processed in the order in which it was received by finding all equipment that meets the facility, module, family and equipment criteria specified in the E10 data request for each piece of equipment and for each reporting interval to be calculated and then finding all WorkStream events that occurred with respect to that equipment. A determination will then be made whether "mapped" or "status" type standard was requested. If user-specified mapping was requested, the events will be mapped to the user-specified E10 categories; otherwise, the status line associated with the WorkStream event will be used to categorize the event into an appropriate E10 category. In either case, time associated with each event is accumulated into the specified E10 category or categories. The time for each category, as well as failure counts, will be summed for each piece of equipment and then used to calculate the E10 metrics.

A technical advantage achieved with the invention is that it ensures that E10 reports are generated accurately and consistently within a fab and across several fabs by standardizing to what E10 categories WorkStream events are to be mapped and then automatically performing the mapping, accumulating the time and failure counts associated with each E10 category.

Another technical advantage achieved with the invention is that it enables the automatic calculation of E10 metrics, thereby eliminating the possibility that a user performing the calculations manually might use incorrect formulas for doing so.

Another technical advantage achieved with the invention is that it is capable of generating a number of different textual and/or graphical reports corresponding to each request, which reports may be standardized or custom, as desired by the user.

Yet another technical advantage achieved with the invention is that it establishes the relationship between a WorkStream event and an E10 state independent of the manufacturing execution system ("MES") and operating business rules. This provides the flexibility to obtain E10 reports without any conversion or change in the MES that could disrupt normal operation thereof. In other words, the present invention provides a method for enabling a multi-fab company to apply E10 standards consistently across all fabs, even though the fabs may operate significantly differently.

Still another technical advantage achieved with the invention is that it responds to, or establishes baseline performance using, new standards without any delay. In this manner, all historical data can be mapped into the new standards and thus be reported correctly. This is not true of previous methods.

BRIEF DESCRIPTION OF THE DRAWINGS

FIG. 3 is a Main Menu screen of the user interface of the system of the present invention.

FIG. 4 is an Event Mapping screen of the user interface of the system of the present invention.

FIG. 5 is an Event Mapping Report screen of the user interface of the system of the present invention.

FIG. 6 is an Event Mappings Reported by Area screen of the user interface of the system of the present invention.

FIG. 7 is an Event Mappings Reported by Mapping screen of the user interface of the system of the present invention.

FIG. 8 is an E10 Reporting Menu of the user interface of the system of the present invention.

FIG. 9 is a Submit E10 Request screen of the user interface of the system of the present invention.

FIG. 10 is a Monitor/Report Request screen of the user interface of the system of the present invention.

FIG. 11 is an Output Parameters window of the user interface of the system of the present invention.

FIGS. 12A–12C illustrate E10 Calculations for Request Report screens of the user interface of the system of the present invention.

FIG. 13 is a Reports for Selected E10 Request Screen of the user interface of the system of the present invention.

FIG. 14 is an Output Parameters window of the user interface of the system of the present invention.

FIG. 17A is a Custom Report Request Entry screen of the user interface of the system of the system of the present invention.

FIG. 17B is an E10 Calc Details Report screen of the user interface of the system of the present invention.

DETAILED DESCRIPTION OF THE PREFERRED EMBODIMENT

Figure 1:
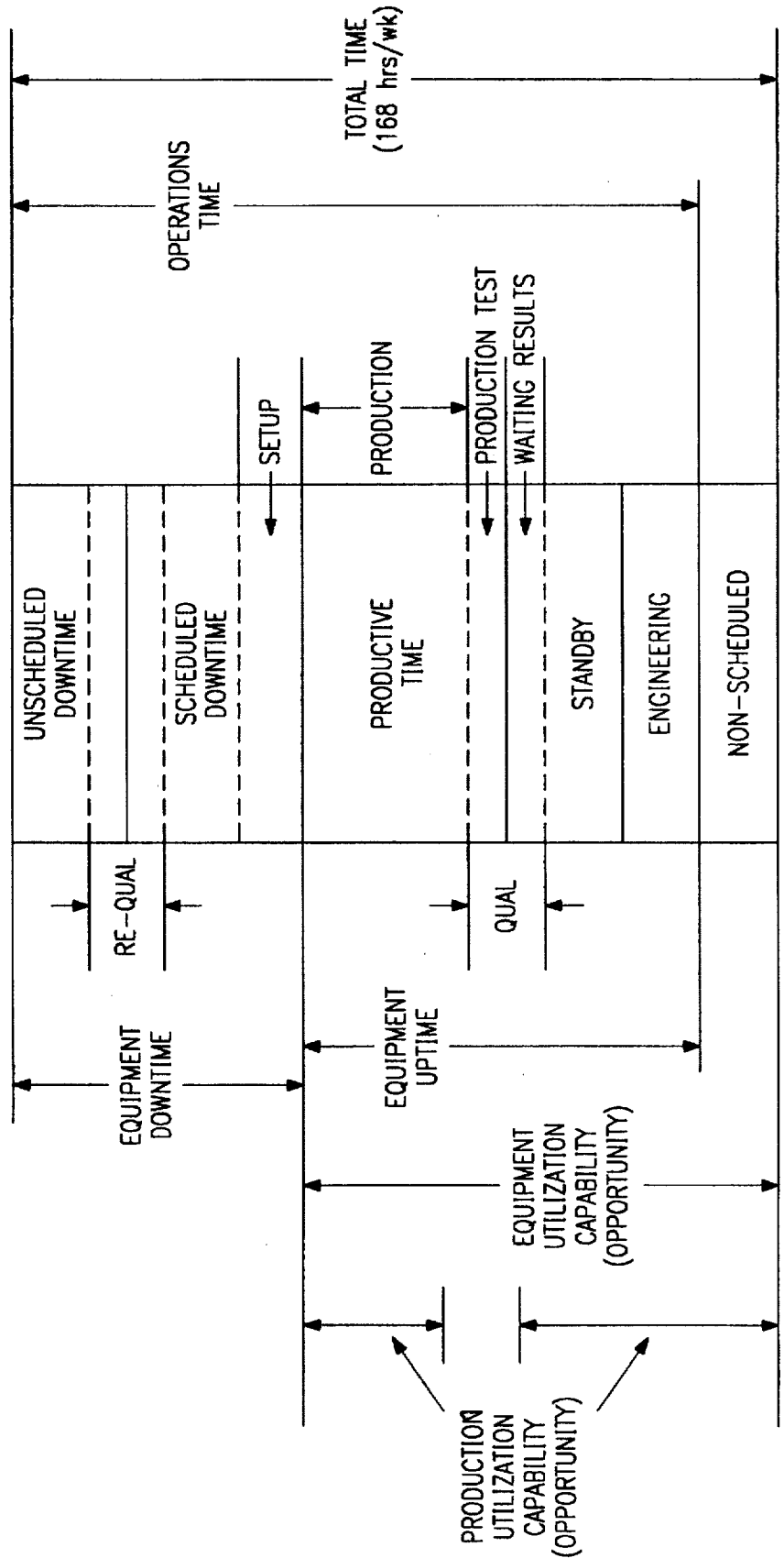
FIG. 1 illustrates the relationship between the six defined E10 states and several different time periods tracked using the system of the present invention.

The present invention comprises a method and a system for automatically and accurately generating E10 reports based on user-selected parameters.

The E10 Standard sets forth several standard definitions for use in measuring and reporting equipment RAM. For ease of reference, selected ones of those definitions are set forth below. In particular, an assist is defined as any unplanned interruption or variance from specification of equipment operation that requires human intervention of less than six minutes to correct. After six minutes have elapsed, an assist becomes a failure (as defined below); however, if intervention is required but there is no interruption of operation within specifications and no component is replaced, the action is an assist regardless of its duration.

A cycle, or equipment cycle, is defined as one complete operational sequence (including product load and unload) of processing, manufacturing, or testing steps for an equipment system or subsystem. In single unit processing systems, the number of cycles equals the number of units (as defined below) processed. In batch systems, the number of cycles equals the number of batches processed.

Downtime is defined as the time during which the equipment is not in a condition, or is not available, to perform its intended function. Downtime does not include any portion of nonscheduled time (as defined below).

Failure is defined as any interruption or variance from the specifications of equipment operation requiring the replacement of a component, other than specified consumables, due to degradation or failure. Failure also includes any assists that interrupt operation and take longer than six minutes. If unplanned corrective action is required, as in a slow degradation that will cause a failure, and this action is scheduled for a later time, to avoid interruption of production, the event is logged as a failure at the time of the corrective action.

Maintenance is defined as the act of sustaining equipment in a condition to perform its intended function.

Nonscheduled time is defined as a period of time during which the equipment is not scheduled to be utilized in production.

Operations time is defined as total time (as defined below) minus nonscheduled time.

Product is defined as any unit that is intended to become a functional semiconductor device.

Ramp-down is defined as the portion of a maintenance procedure required to prepare the equipment for hands-on work. Ramp-down is only include in scheduled and unscheduled downtime.

Ramp-up is defined as the portion of a maintenance procedure required, after the hands-on work is completed, to return the equipment to a condition in which it can perform its intended function. Ramp-up is only included in scheduled and unscheduled downtime.

Shutdown is defined as the time required to put the equipment in a safe condition when entering a nonscheduled state. Shutdown is only included in nonscheduled time.

Start-up is defined as the time required for equipment to achieve a condition in which it can perform its intended function when leaving a nonscheduled state. Start-up is only included in nonscheduled time.

Total time is defined as all time (at the rate of twenty-four hours per day, seven days per week) during the period being measured.

A unit is defined as any wafer, die, packaged device, or piece part thereof.

Uptime is defined as the time period during which the equipment is in a condition to perform its intended function.

As previously indicated, to facilitate the accurate measurement of certain aspects of equipment performance, or RAM, the E10 Standard defines six basic equipment states into which all equipment conditions and periods of time must be categorized. The equipment states are determined by function, rather than by organization. For example, any given maintenance procedure is classified in the same manner, no matter who performs it. FIG. 1 illustrates a chart of the six basic equipment states. Key blocks of time are identified for use in equations defined by the E10 standard. Although not shown, it will be recognized by those skilled in the art that the basic equipment states shown in FIG. 1 may be divided into several substates to achieve the equipment tracking resolution that a manufacturing operation desires.

The amounts of time spent by a piece of equipment in each of the above-defined states are used to calculate a plurality of metrics for the equipment as defined by the E10 Standard. For ease of reference, the E10 metrics, as well as the equations used to calculate them, are set forth below in Table I.

TABLE I

| Metric (Abbreviation) | Equation |
|---|---|
| Mean (Productive) Time between Failures (MTBFp) | productive time/# failures |
| Mean Time Between Machine Failures (MTBFm) | productive time/(# failures − # nonmachine failures) |
| Mean (Productive) Time Between Assists (MTBAp) | productive time/# assists |
| Mean Time to Repair (MTTR) | total repair time/# failures |
| Mean Time Off Line (MTOL) | total equipment downtime/# downtime incidents |
| Mean Cycle Between Failures (MCBF) | total equipment cycles/# failures |
| Mean Cycle Between Assists (MCBA) | total equipment cycles/# assists |
| Equipment Dependent Uptime (%) (EDUT) | equipment uptime/(operations time − (all maintenance delay + out of spec + facility related downtime)) * 100 |
| Supplier Dependent Uptime (%) (SDUT) | equipment uptime/operations time − (user maintenance delay + out of spec + facility related downtime)) * 100 |
| Operational Uptime (%) (OPUPT) | (equipment uptime/operations time) * 100 |
| Operational Utilization (%) (OPT) | (productive time/operations time) * 100 |
| Total Utilization (%) (TOUT) | (productive time/total time) * 100 |

Figure 2:
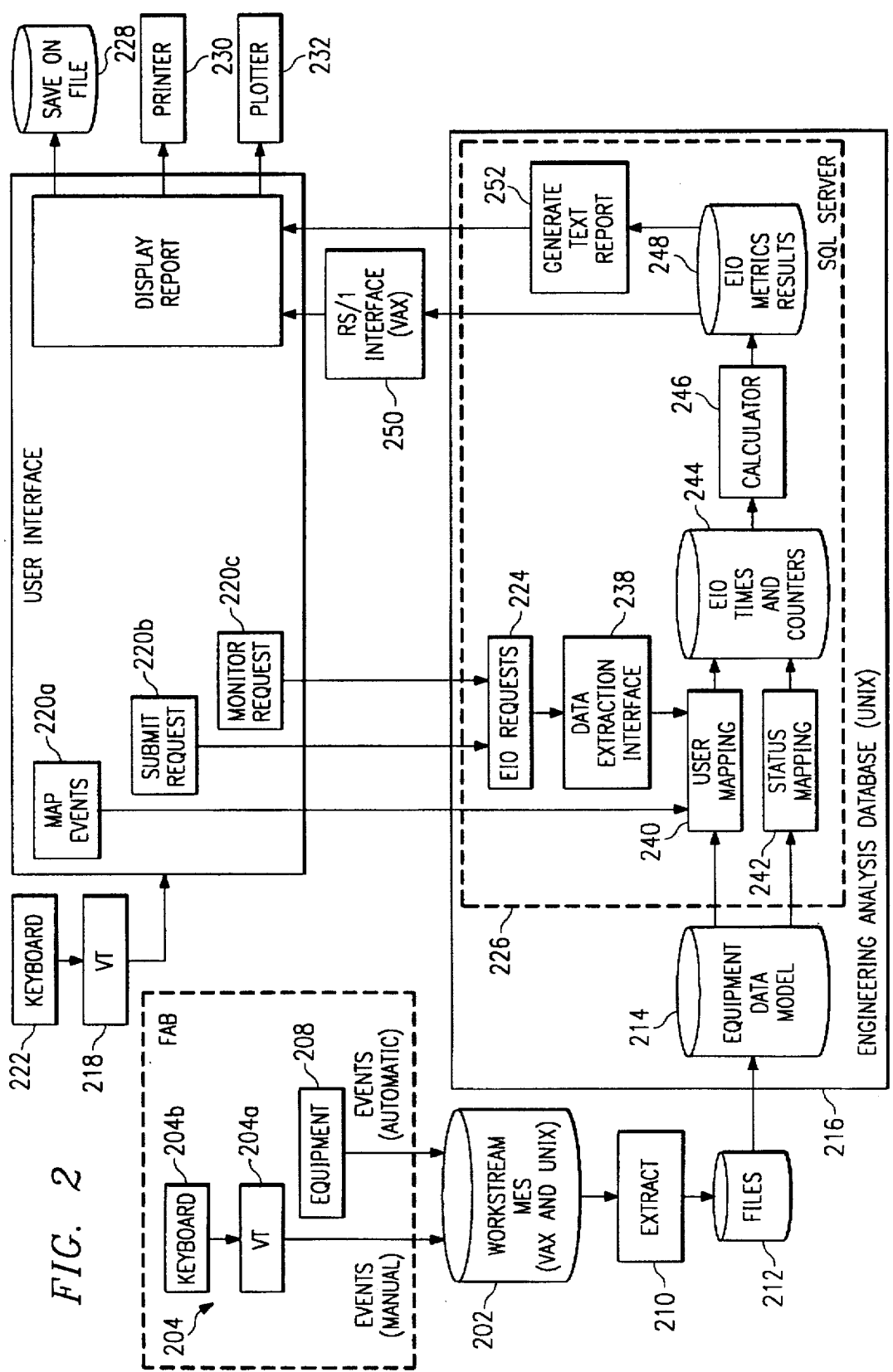
FIG. 2 is a system block diagram of a hardware environment in which the system of the present invention is preferably implemented.

FIG. 2 illustrates a preferred hardware environment 200 for implementing the system of the present invention. Referring to FIG. 2, it will be recognized that transactional databases, such as a database 202, are well known to those skilled in the art of database management. As is also well know, transactional databases may be used for modeling the behavior and status of a number of different objects, including fab equipment. Various products have been known in the prior art to model manufacturing execution systems (MESs) using such a transactional database, an example of which is WorkStream, available from Consilium, Inc., of Mountain View, Calif. The WorkStream MES provides means for operators at a number of different workstations, such as a workstation 204, comprising a video terminal ("VT") 204a and associated keyboard 204b, located throughout a fab 206, to update the database 202 as the status of equipment in the fab changes by manually logging "events" and "failures," hereinafter collectively referred to as "events," into the database 202. For instance, a piece of equipment 208 may be brought down for repair or placed into different operating modes or may undergo a machine or nonmachine failure. The database 202 must be updated to reflect this information. As previously indicated, this updating may be accomplished manually by a user logging events via the workstation 204; alternatively, events may be logged into the WorkStream database 202 automatically by the equipment 208 itself.

A plurality of workstations, represented by the workstation 204, may be used to log events in connection with the status of equipment located in the fab 206 into the database 202. In accordance with the features of the present invention, data stored in the database 202 an extraction interface 210 extracts the WorkStream event and failure data into files 212, which are input to an equipment data model 214 of a UNIX-based engineering analysis database 216. The equipment data model 214 consists of tables and relations that describe information about equipment in the fab 206, such as when the equipment is run, who owns the equipment, when failures occur and what those failures are, etc.

As will be described in detail, users at a plurality of VTs, represented by a VT 218, outside the fab 206 can interact with the database 216 through a user interface 220 to specify how WorkStream events are to be mapped via a map events function 220a, submit E10 data requests 224 to an SQL server 226 of the database 216 via a submit request function 220b, or monitor the status of previously submitted requests 224 via a monitor request function 220c, using the VT 218 and its associated keyboard 222. As will also be described, each E10 data request delineates the information to be included in the report, as well as the format (i.e., textual or graphical) in which the report should be presented. In addition, the user may specify whether the requested report is to be displayed on the VT 218 using a display interface 220d, saved to a file 228, and/or sent to a printer 230 and/or plotter 232 for generating hard copies of textual reports and graphical reports, respectively.

In a preferred embodiment, the VT 218 is at least a VT-100 class terminal available from Digital Equipment Corporation (DEC), of Waltham, Mass. In order to display graphs on the VT 218, at least a VT-330 must be used, and a VT-340 (color) is recommended.

As will be described in further detail, responsive to submission of an E10 data request 224 to the server 226, a data extraction interface 238 causes events stored in the equipment data model 214 and corresponding to the information specified in the request to be output to one of two mapping interfaces, which are a user-specified mapping interface 240 and a WorkStream status line mapping interface 242, as also specified in the request, for mapping the extracted events to the appropriate E10 states. The times and counts for each E10 state are accumulated in time and count bins in a database 244 and then output to a calculator function 246 which calculates E10 metrics 248. The E10 metrics are displayed on the VT 218 via an RS/1 interface 250, for graphics reports, and a text report generator 252, for text reports. RS/1 is commercially available from BBN Software Products Corporation of Cambridge, Mass.

Conceptually, the system of the present invention, the operational details of which will be described with reference to FIGS. 18A–18C, comprises two primary functions; namely, a data extraction function and a reporting application function. The reporting application function provides several major functional capabilities, including enabling the user to formulate restriction information, or E10 data requests, for data extraction and reporting purposes. Each E10 data request identifies, as a function of facility (or manufacturing area), module, family and/or equipment, the equipment list for which data is to be accumulated. In addition, the E10 data request specifies a time period for reporting and duration type to report on. In addition, the reporting application function enables the user to display all E10 calculations for each piece of equipment in the extracted data set and to display, via the VT 218, and/or the printer 230 or plotter 232, standard and custom graphic reports from the extracted E10 metrics.

The data extraction function provides the data extraction capabilities and E10 data request management by managing and executing the requests submitted by users and purging old requests from the queue. The request results collected in the database 216 are not permanent. The requests and underlying data will remain in the database 216 for a specified period of time, for example, two weeks.

As will be described in detail, once an E10 data request has been submitted, the request will be processed in the order in which it was received by finding all equipment that meets the facility, module, family and equipment criteria specified in the request for each piece of equipment and for reach reporting interval to be calculated and then finding all WorkStream events that occurred with respect to that equipment. A determination will then be made whether "mapped" or "status" type standard was requested. If user-specified mapping was requested, the events will be mapped to the user-specified E10 categories; otherwise, the status line associated with the WorkStream event will be used to categorize the event into an appropriate E10 category. In either case, time associated with each event is accumulated into the specified E10 category or categories. The time for each category, as well as failure counts, will be summed for each piece of equipment and then used to calculate the E10 metrics.

The organization of the equipment and event data into the proper E10 categories requires configuration at the server 226 level. This configuration is normally done once by a technician who manages the equipment. Two different methods are employed to correctly categorize the equipment time periods into the appropriate E10 categories, including "status" and "mapped." Status involves setting an event's status line in WorkStream. Mapped is performed using the Map Events function detailed below.

FIGS. 3–17B illustrate the user interface of the system of the present invention. In particular, there are four different types of user interface displays, including menus, screens, graphic reports and text reports. The menus, screens and text reports are generated using a standard ORACLE environment and therefore share common, and well known, features. The graphic reports are generated using the RS/1 interface 250.

FIG. 3 illustrates a main menu screen of the user interface of the system of the present invention. As shown in FIG. 3, a user is presented with a menu comprising eight menu options, numbered 1 through 8. The "UP ARROW" and "DOWN ARROW" keys of the keyboard 17 may be used to highlight one of the menu options. Once the appropriate selection is highlighted, pressing a RETURN or ENTER key will bring up the input screen or menu associated with the selection. Alternatively, typing the number of the option and then RETURN or ENTER will also bring up the screen or menu for the selection. In view of the fact that only menu options 3, 4, 6 and 8 are related to the present invention, only those options will be detailed herein.

As will be described in greater detail below, selection of an "Event Mapping Report" option (option number 3) from the main menu screen (FIG. 3) brings up a report that displays all currently defined event mappings used to classify WorkStream events for reporting purposes. Selection of a "Map Events" option (option number 4) enables the user to view events by facility and to specify how various WorkStream events are to be mapped. Selection of an "E10 Graphics" option (option 6) leads to another menu that provides access to the E10 reporting functions, which functions include submission of E10 data requests to the database 216, monitoring the state of any data request, defining custom E10 reports for any data extraction, generating and displaying one or more standard E10 reports, generating and displaying one or more custom E10 reports, displaying the values of all E10 calculations of any completed data extraction, and displaying a description of all E10 calculations.

As previously indicated, the Map Events option enables the user to view events by facility and to specify mappings for various WorkStream events. In general, event mapping is used to classify events into groups of related events. These mappings are then used to categorize the time of an event for E10 reporting purposes Proper use of these E10 mappings will allow the time associated with each WorkStream event to be reported properly Each E10 mapping may have one or more E10 reporting categories associated with it. For example, to map an event to "SCH-PROD" would mean that the time duration of that event could be categorized as "Production," "Productive Time," "Equipment Uptime," "Equipment Utilization Capability," "Production Utilization Capability,' and "Operation Time." E10 report requests allow the user to choose whether the user-defined mappings, specified using the Map Events option, or the WorkStream event's status line should be used in determining how the event should be mapped. E10 reports will be driven off these mappings. Because the Map Events option enables a user to specify mappings, it is anticipated that only designated "key" users will have access to the Map Events function.

Referring again to FIG. 3, selection of the Map Events option results in the display of a Map Events screen, as shown in FIG. 4. At that point, the user is required to enter values in various fields, including a "Manufacturing Area Name" field, an "Only Show Events Without E10 Mapping?" field, an "Events" field, an "E10 Mapping" field, and an "E10 Mapping-Categorizations" field.

The Manufacturing Area Name field enables a user to specify a particular fabrication facility, for example, "FAB10," for which to map events. Pressing a FIND/LIST key of the keyboard 222 will bring up a list of all available facilities. The Only Show Events Without E10 Mapping? field should be filled in with a "Y" if the user wants to see only those WorkStream events that do not already have an E10 mapping or an "N" if the user wants all events to be displayed. The Events field is used to indicate which WorkStream events should be listed. In the example shown in FIG. 4, a wildcard entry "%REP%" in the Events field has resulted in all WorkStream events that contain the string "REP" being displayed in the box beneath the field. The E10 Mapping field contains the mapping used for the E10 Reports. The user must enter a value in this field before the cursor will be able to leave the field. The E10 Mapping field is a "list of values" field, meaning that pressing a FIND/LIST key while the E10 Mapping field is selected will bring up a list of valid entries for that field from which the user may then select. Finally, the E10 Mapping-Categorizations field is for display purposes only and shows to what E10 categories each E10 mapping relates. These categories are used for performing E10 calculations, as will be described.

Referring again to FIG. 3, selection of the Event Mapping Report option results in the display of an Event Mapping Report screen, as shown in FIG. 5. The Event Mapping Report screen displays currently assigned mappings and comprises an output parameters section 500, a sort options section 502, and an event data restriction section 504.

Referring to the output parameters section 500, entering a "Y" in a "Create Reports in Batch Mode" field will send all output reports to the printer designated in a "Printer" field, and/or to the file designated in a "Report Filename" field, while entering an "N" in the field will require the user manually to send the reports to a printer or file. Pressing the FIND/LIST key while the Printer field is selected will display a list of printers from which the user may select.

Referring to the sort options section 502, a "Sorted By" field allows the user to designate the sort order in which the data is to be displayed. The first sort option (Facility, Event, Mapping) sorts the data first by fabrication facility, then by event within the facility, and finally by mapping. The second sort option (Mapping, Facility, Event) sorts the data by mapping across all fabrication facilities, then by fabrication facility, and finally by event. Pressing any key while cursor rests on either of the two options will cause that option to be marked with an "X," while pressing the SPACEBAR will clear the X from the option. To generate both types of reports, a user should mark both fields with an X.

Referring to the event data restriction section 504, the user may designate, via a "Show Event Mappings For" field, the event mappings for one or more facilities and/or one or more mapping types. An Event Mappings Reported by Area (Facility) report is useful if the user wants to see all of the events in a facility and how they are mapped. An example of such a report for FAB 15 for all mapping types is shown in FIG. 6. In contrast, an Event Mappings Reported by Mapping report displays the events that are included in each mapping. Underneath each mapping, the events are sorted by facility. An example of such a report for two types of mappings, i.e., "NO E10 CAT" and "ACTIVE," for FAB 15 is shown in FIG. 7.

Referring again to FIG. 3, selection of the Event Mapping Report option results in the display of an Event Mapping Report screen, as shown in FIG. 5. The Event Mapping Report screen displays currently assigned mappings and comprises an output parameters section 500, a sort options section 502, and an event data restriction section 504.

Referring again to FIG. 3, selection of the E10 Graphics option from the Main Menu screen results in the generation of an E10 Reporting Menu screen, as shown in FIG. 8. This menu guides the user through the various report options and functions provided by the E10 reporting tool. As shown in FIG. 8, the E10 Reporting Menu screen comprises five options, two of which ("Return to Main Menu" and "Exit System") are self explanatory and therefore not further described in detail herein. The remaining three options, i.e., "Data Extraction Request," "Monitor/Report Request," and "E10 Calc Detail Report," are described below.

Selection of the Data Extraction Request option (option number 1) from the E10 Reporting Menu enables the user to submit an E10 data request that consists of specifications for the time period and equipment to be included in the report. Selection of the Data Extraction Request option results in the display of a Submit E10 Request screen, as shown in FIG. 9. The Submit E10 Request screen comprises a plurality of fields, including a "'M'apping or 'S'tatus Standard" field, an "'A'verage or 'T'rend Calculations" field, a "Date Range" field, a "Site" field, a "Manufacturing Area" field, a "Module" field, an "Equipment Family" field and an "Equipment ID" field. In the preferred embodiment, values must be entered in the 'M'apping or 'S'tatus standard, 'A'verage or 'T'rend Calculations, Date Range and Site fields for the request to be considered valid, while entries in the remaining fields are optional. In particular, referring to the 'M'apping or 'S'tatus Line field, the user is required to enter an "M" for user-specified mapping or "S" for status line mapping. The user-specified mapping method provides the necessary association between WorkStream events and an E10 state to correctly categorize the event interval information. It is a database mapping method that enables the association of currently defined WorkStream events to the appropriate E10 category, as assigned using the Map Events function (FIG. 4). The status line method provides the necessary association through the WorkStream event status field. This method takes the status information from the WorkStream events and performs the E10 state definition based on that information.

The 'A'verage or 'T'rend Calculations field enables the user to select to report the data averaged over the specified time frame based on the selected equipment by entering an "A" in the field, or to select to report the data averaged over each work week within the specified time frame, in addition to viewing the data averaged over the entire time frame, by entering a "T" in the field. The Date Range field enables the user to identify a date range for a report by entering the appropriate dates in the "From" and "To" subfields using the format MM/DD/YY. As a practical matter, it should be noted that a shorter time interval may make a piece of equipment appear more reliable (or unreliable) than it actually is. In other words, the longer the time interval, the more accurate the report will be. The Site field enables a user to enter the name of the desired fab site location, e.g., "AUSTIN.". The Manufacturing Area field enables the user to designate a particular fabrication facility, e.g. "FAB 14." It should be obvious that only manufacturing areas within the specified Site may be entered in this field. The Module field enables the user to designate a particular module, e.g., "THINFILMS," within the designated manufacturing area from which the equipment came. This field cannot be used unless the Site and Manufacturing Area fields have been filled in. The Equipment Family field allows a user to designate a group of related entities. Again, this field cannot be used unless the Site and Manufacturing Area fields have been filled in. The Equipment ID field enables the user to enter the name of a single piece of equipment for which a report is to be generated. Again, this field cannot be used unless the Site and Manufacturing Area fields have been filled in. In this regard, it should be obvious that the nature of the relationship between the Manufacturing Area field and the Equipment ID field, via the Module and/or Equipment Family fields, is hierarchical, in that if the Manufacturing Area field is left blank, the remaining fields must remain blank.

Once all of the appropriate fields have been completed, pressing a DO/COMMIT key will submit the request to the database 216 for processing. The request is assigned an ID number, which will be displayed on the help line near the bottom of the screen of the screen once the request has been successfully submitted. As will be described, the ID number will also be displayed on the Monitor/Report Request Screen (FIG. 10) in the Request ID field.

Referring again to the E10 Reporting Menu screen (FIG. 8), selection of the Monitor/Report Request option (option number 2) results in display of a Monitor/Report Request screen, as shown in FIG. 10. As will be described, the Monitor/Report Request screen enables a user to monitor requests submitted from the Submit E10 Request screen (FIG. 9). The Monitor/Report Request screen comprises two sections, including a request listing section 1000 and a request details section 1002.

Each line of the request listing section 1000 corresponds to a request and requests are identified in the request listing section 1000 by their ID number, which is set forth in a "Request ID" field. This number is the same number that appears in the help line of the Submit E10 Request screen (FIG. 9) after a request has been successfully submitted. A "Request Status" field contains an indication of the current status of the report identified in the Request ID field. There are three valid values for this field, including are "SUBMITTED," which designates reports that have not yet been processed, "WORKING," which designates reports that are currently being processed, and "COMPLETED," which designates files that have been processed and may be accessed. The Manufacturing Area, Module, Equipment Family, Equipment ID and Date Range fields contain the information entered in the corresponding fields of the Submit E10 Request screen (FIG. 9) that generated the request. Finally, a "Request Made By" field contains the userID of the user that submitted the request.

When the cursor is navigated onto a request, further details for that request will be displayed in the request details section 1002. For example, as shown in FIG. 10, the cursor has been navigated onto a request having a request ID of "421." As a result, further details for request 421 are displayed in the request details section 1002. The request details section 1002 includes a "Request ID" field and a "Request Made By" field, each of which contains entries that are identical to the corresponding fields in the request listing section 1000. A "Request Date" field contains the date the request was submitted, in this case, "12/13/94." A "Standard Used" field contains the standard (i.e., "mapped" or "status") used for mapping events to E10 categories, as specified in the 'M'apping or 'S'tatus Standard field of the Submit E10 Request screen (FIG. 9). A "Duration Type" contains the type of time period entered for the request (i.e., "trended" or "averaged"), as specified in the 'A'verage or 'T'rend Calculations field of the Submit E10 Request screen (FIG. 9). A "Site" field identifies the location of the fabrication facility, in this case, "AUSTIN."

If the entry in the Status field of a request does not indicate that it is COMPLETED, the user may perform no further actions on the request until the status is COMPLETED. Pressing the F12 key refreshes the Monitor/Report Request screen, thereby updating the status of the requests listed in the request listing section 1000. Once the request has a status of COMPLETED, the user may view a text report showing the values for all E10 calculations for every piece of equipment and time frame found for the request, as described in detail below, by selecting the request ID of the report and then pressing the DO/COMMIT key. In addition, for any request that has a status of COMPLETED, the user may view a Report For E10 Request screen, as shown in FIG. 13, for a request by selecting the request and then pressing a PAGE DOWN/NEXT BLOCK key.

From the Monitor/Report Request screen (FIG. 10), the user may navigate the cursor to the request for which he or she wishes to print a report, at which point the user may press the DO/COMMIT key to print the report. As shown in FIG. 11, this will result in the display of a pop-up window 1100 for entering output parameters for the report. At that point, the user must enter appropriate values in each of "Create Reports in Batch Mode?," "Report Filename," "Printer," and "Save as Default?" fields of the window 1100. In particular, entering a "Y" in the Create Reports in Batch Mode? field will cause the report to be created by a batch job and written to a file designated in the Report Filename field and/or printed on the printer designated in the Printer field, while entering an "N" in the field will cause the reports to be created interactively and displayed using a default editor of the host platform.

A copy of the text report will be saved to a file named [filename].DAT, where filename is the filename specified in the Report Filename field. If no filename is specified in the Report Filename field, then no copy of the text file will be saved. Similarly, a copy of the report will be printed to the printer specified in the Printer field, if that field is filled in. Pressing a FIND/LIST key gives the user a list of printers from which to select. Finally, entering a "Y" in the Save as Default? field will enable the user to save the entries in the window 1100 as default values to be used in generating an E10 Calculations for Request Report, as shown and described with reference to FIG. 12. The values that are saved are those stored in the Create Reports in Batch Mode?, Printer and Report Filename fields. These values will appear in the appropriate fields the next time the user attempts to output the E10 Calculations for Request Report.

The E10 Calculations for Request Report shows all possible E10 calculations by name, and the value for every piece of equipment that meets the criteria specified using the Submit E10 Request screen (FIG. 9). If the data request was trended, then the report shows the values for every week. It may also show data summed at family, module, area or sum of all equipment level, if there are report requests at that level. An exemplary E10 Calculations for Request Report is shown in FIG. 12.

Referring again to the Monitor/Report Request screen (FIG. 10), navigating the cursor to highlight the report for which the user wishes to print the report and then pressing the PAGE DOWN/NEXT SCREEN key results in the display of a Reports for Selected E10 Request screen, as shown in FIG. 13. The Request ID number of the selected request is displayed in a field at the top of the screen. A report list comprising default reports and user-defined reports is displayed in a report listing section 1300. Depending on what level at which the data was extracted (i.e., manufacturing area, module, equipment, etc.), the default reports will be summed at varying levels. For example, if the extract was for ALL equipment, default reports will exist for ALL equipment and for each area. If the extract was for a single area, default reports will exist for the requested area. If the extract was for a single module, default report will exist for the requested module. If the extract was for a single family, default reports will exist for the requested family and for each piece of equipment in the family. If the extract was for a single piece of equipment, default reports will exist for the requested piece of equipment.

The report listing section 1300 comprises an "X" field, a "Report Title" field and a "Calc Status" field. The X field of any report to be output should be marked with an "X." The Report Title field specifies the title of the report. The Calc Status field contains the current status of the report. Again, the three valid entries for this field are "SUBMITTED" for reports that are not yet processed, "WORKING" for reports that are currently being processed, and "COMPLETED" for reports that have been processed. Only reports that are COMPLETED may be marked with an X for output.

Figure 15:
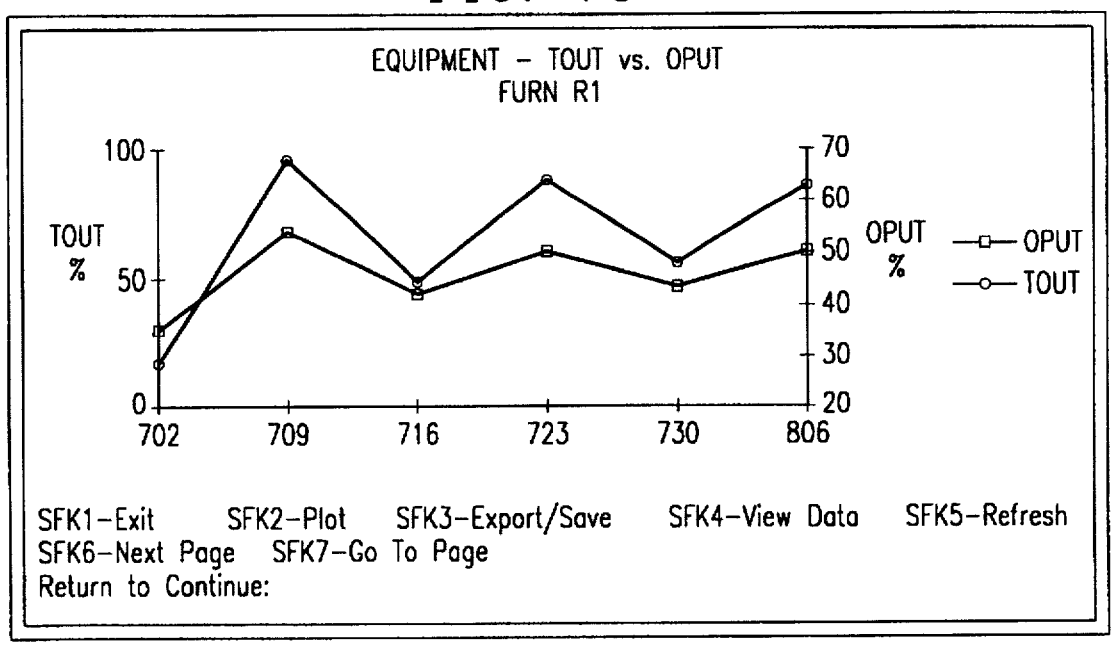
FIG. 15 is an exemplary graph generated by the system of the present invention.
Figure 16:
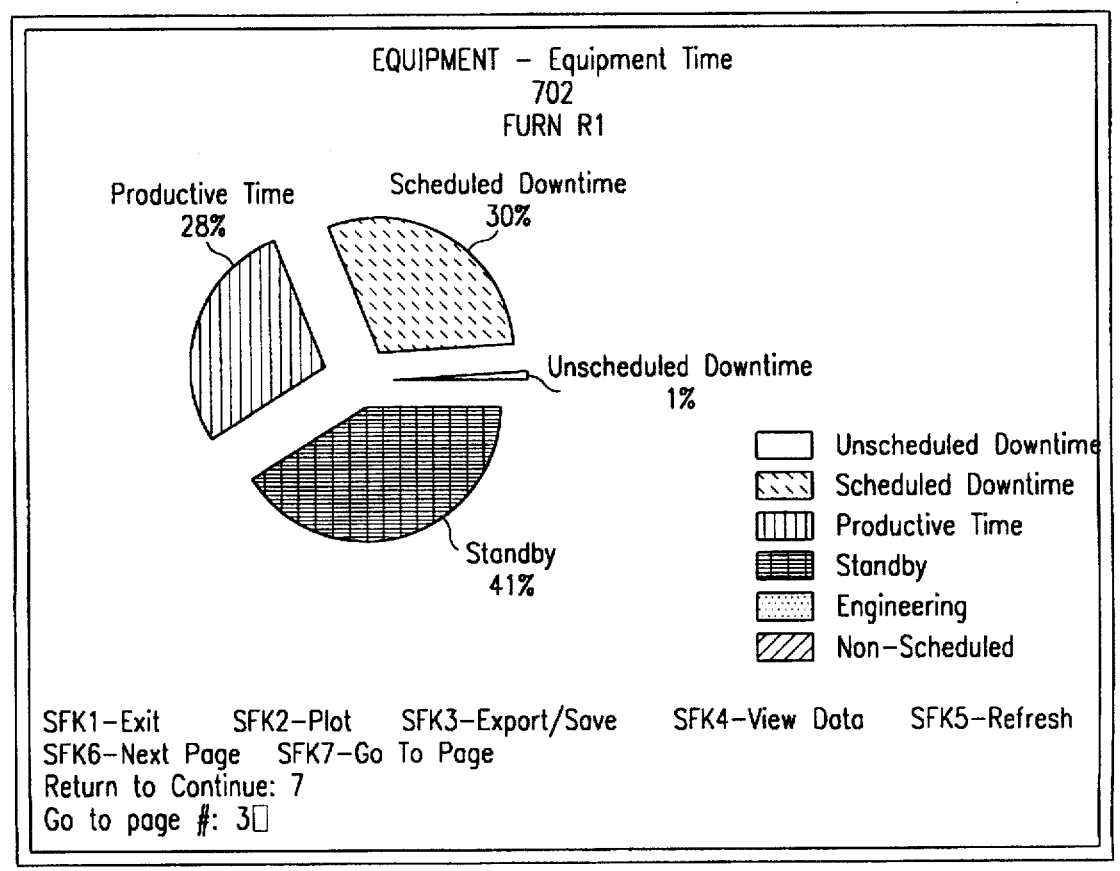
FIG. 16 is an exemplary pie chart generated by the system of the present invention.

When a report in the Report Listing section 1300 is highlighted, further details for the report are displayed in Report Details and Calculations sections 1302 and 1304, respectively. In particular, "Area," "Module," "Family" and "Equipment" fields of the Report Details section 1302 contain the parameters used to select data for the selected report. An "Entity Level" field identifies the entity level at which the data is summed. Valid entries for the Entity Level include Equipment, Family, Module, Area and All Equipment. For example, an entity level of "Family" would have a report that listed families only and not individual pieces of equipment. A "Time Level" field contains the time level at which the data is grouped. Valid entries for the Time Level field include "Weekly" and "Entire Time." A "Report Type" field indicates the type of report, either Bar Graph or Pie Chart, to be generated. An exemplary bar graph and pie chart are shown in FIGS. 15 and 16, respectively.

The Calculations section 1304 identifies the E10 calculations contained in the report and on what axis, i.e., Y1 (left Y) or Y2 (right Y) the calculations are displayed. If a report does not have a status of COMPLETED, the user may not mark the report for output until the report is completed. To refresh the screen with the latest status of the reports, the user may press the F12 key. If the user has marked one or more reports with an X, pressing the DO/COMMIT key causes the selected reports to be output, as described below. At any time, the user may create a custom report by pressing the INSERT/CREATE record key, which will take the user to the Custom Report Request Entry screen, as shown and described below with reference to FIG. 17A.

From the Reports for Selected Request screen (FIG. 13), once the user has marked the reports to be output with an X and then pressed the DO/COMMIT key, as shown in FIG. 14, an Output Parameters window 1400 will be displayed. The Output Parameters window 1400 includes a "Create Reports in Batch Mode?" field, a "Report Filename" field, a "Printer" field, a "Plotter" field, and a "Save as Default" field. Entering a "Y" in the Create Reports in Batch Mode? field will send all of the requested reports to a printer and/or plotter designated in the Printer and/or Plotter field, respectively. Entering an "N" in this field will cause the reports to be displayed using the RS/1 interface 250.

If the reports are to be output in batch mode, a dump of the report's data will be sent to the printer designated in the Printer field; otherwise, a printout of the report's data will not be generated. If the report is output in interactive mode, then completing this field simply initializes the printer name. Pressing the FIND/LIST key gives the user a list of printers from which to select. Similarly, if graphs are to be output in batch mode, a dump of the graph's data will be sent to the plotter entered in the Plotter field. If not entered when in batch mode, then a plot of the graph will not be entered. If the graph is to be output in interactive mode, then entering this field simply initializes the plotter name. Pressing the FIND/LIST key gives the user a list of plotters from which to select.

Finally, entering a "Y" in the Save as Default? field enables the user to save the entries on the screen as the default values for outputting the selected E10 reports. The fields for which values are retained are the Create Reports in Batch Mode?, Printer, Plotter and Report Filename fields. These values will be displayed in the appropriate fields the next time the user attempts to output selected E10 reports.

Once all of the fields have been filled in, pressing the DO/COMMIT key causes the selected reports to be output. The reports will be sent sequentially for processing. If the reports were not sent in batch mode, then, as each report is prepared, the screen will blank, and the following message will be displayed:

Performing Data Extraction

You may press CTRL-Y to cancel all graph generation

At that time, the user may abort the creation of the current graph and all subsequent graphs by pressing CTRL-Y. If the user chooses not to abort, then the next marked graph will be displayed. When the user exits that graph, if he or she has marked additional graphs for output, the screen will blank again, and the above message will be redisplayed. This continues until the user exits the RS/1 interface for the last graph, at which point the user is returned to the Reports for Selected E10 Request screen (FIG. 13).

An exemplary bar graph of a report titled "EQUIPMENT-TOUT vs. OPUT" for a piece of equipment designated "FURN A1" generated using the Reports for Selected E10 Request screen (FIG. 13) is shown in FIG. 15. Similarly, an exemplary pie chart of a report rifled "EQUIPMENT-Equipment Time" for the piece of equipment designated FURN A1 generated using the Reports for Selected E10 Request screen (FIG. 13) is shown in FIG. 16.

As previously indicated, from the Reports for Selected E10 Request screen (FIG. 13), the user's navigating the cursor to the request for which he or she wishes to display and/or print the COMPLETED report and then pressing the INSERT/CREATE RECORD key results in the display of a Custom Report Request Entry screen, as shown in FIG. 17A. Using the Custom Report Request Entry screen (FIG. 17A), the user can generate custom requests and reports. The Custom Report Request Entry screen comprises a Report Primary Parameters section 1700 and a Report Calculation section 1702. The Report Primary Parameters section 1700 includes a "Report Type" field, a "Time Level" field, an "Entity Level" field, "Area," "Module," "Family" and "Equipment" fields, a "Report Title" field and an "X-axis Label" field. With regard to the Report Type field, the user has two options, which are Bar Graph (1), such as that shown in FIG. 15, or Pie Chart (2), such as that shown in FIG. 16. If a Pie Chart is chosen, all calculations for the chosen units will be selected automatically; the user is not given an opportunity to modify them. The entry in the Time Level field will be "entire time" for averaged data requests, or "weekly" or "entire time" for trended requests. The Entity Level field indicates the entity level at which the data is summed. The valid levels are Equipment, Family, Module, Area and All Equipment. For example, an entity level of "Family" would have a report that listed families only and not individual pieces of equipment. The selection of values for the Entity Level field is limited to the original request (FIG. 9). For example, if the E10 Report Request specified a single piece of equipment, the user may not choose to show the report summed the all equipment, area, module, or family levels.

The values contained in the Area, Module, Family and Equipment fields will default to the values set forth in the request (FIG. 9). If the data request had values in those fields, then the values cannot be changed; however, blank values may be modified for reporting purposes. The fields that the user enters determine what entity levels are valid for reporting. For example, if the user has limited the request to a single piece of equipment, the user may not have the data summed at the higher "Area" level. In addition, if the user has specified just one area for reporting, then he or she may report on every piece of equipment, or every family or every module within that area.

The Report Title field must be completed in order to proceed. This will be the main identifier of the report in the report listing section 1300 (FIG. 13) and will print as the heading of the report. Finally, the X-axis Label field will designate the label that appears underneath the X-axis on the report.

In the preferred embodiment, there are two Y axes on which calculations may be displayed. The Y1 axis is on the left side of the graph and the Y2 axis is on the right side of the graph. If a pie chart is specified, then only the Y1 axis information is used. If a bar graph is specified, then one or more calculations may be included on the Y axis or one and only one calculation may be included on each of the Y1 and Y2 axes. The Report Calculations section 1702 is further divided into a "Calculations on Y1 Axis" section 1702a and a "Calculations on Y2 Axis" section 1702b. Each section includes a Label field, a Units field, and a List of Calculations field for the respective axis. In particular, the Y1- and Y2-axis Label fields designate the labels that appear to the left of the Y1 axis and the right of the Y2 axis, respectively.

The Y2-axis Label field may be used only if one and only one calculation on the Y1-axis has been marked. The Y1- and Y2-axis Units designate the units of measure in which the calculations on the Y1- and Y2-axes, respectively, will be displayed. Pressing the FIND/LIST key brings up a list of valid units. The units selected will determine from what calculations a user may select. The List of Y1- and Y2-axis Calculations fields are filled automatically once the corresponding units fields have been filled. At that point, the user marks with an "X" the calculations that he or she wishes to display. For Pie Charts, all calculations are marked and cannot be unmarked.

Pressing DO/COMMIT saves the custom report, at which point the user is returned to the Reports for Selected E10 Requests screen (FIG. 13). Once the report is completed, the report will be marked for output and the Output Parameters pop-up window 1400 (FIG. 14) will be displayed to enable the user to output the custom report. Until the report is completed, request will be displayed in the Report Listing section 1300 of the Reports for Selected E10 Requests screen (FIG. 13) screen with a status of "SUBMITTED" or "WORKING."

Referring again to the E10 Reporting Menu (FIG. 8), selecting the E10 Calc Details Report option displays a list of the E10 calculations and the formulas used to calculate each of them. A screen for entering output parameters, similar to the popup window shown in FIGS. 11 and 14, is displayed for enabling the user to enter output parameters. Once the output parameters have been entered, an E10 Calc Details Report, as shown in FIG. 17B, is displayed.

All requests generated using the Submit E10 Request screen (FIG. 9) are stored in an E10_REQUEST table of the database 14. One field of this table indicates the request status of the request, which may be "'P'ending," "'C'ompleted," or "'E'rror." As will be described in detail with reference to FIGS. 18A–18C, an series of procedures are executed periodically to process those requests that have a status of pending.

Figure 18A:
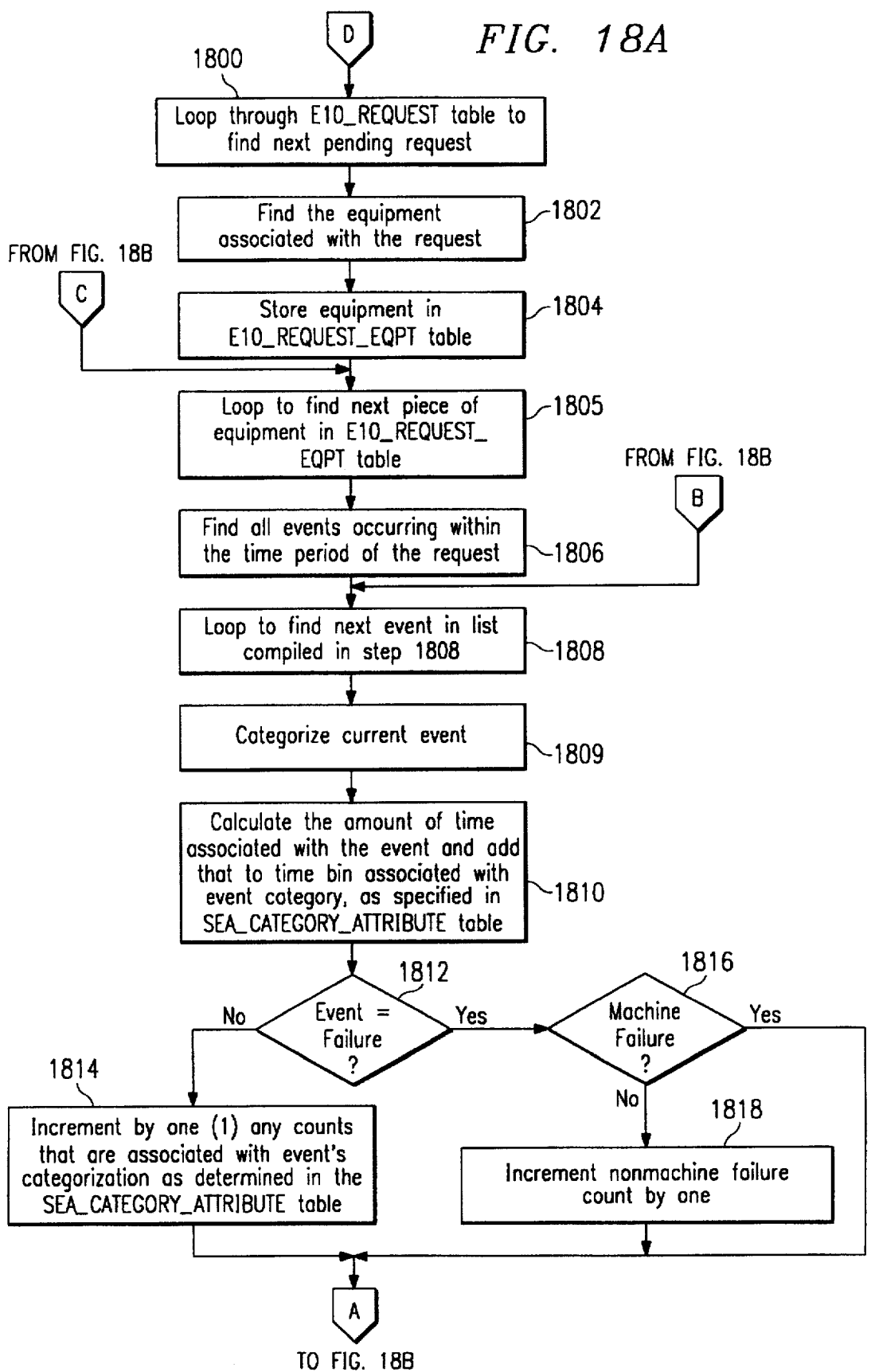
FIGS. 18A–18C are a flowchart illustrating the method of the present invention.
Figure 18B:
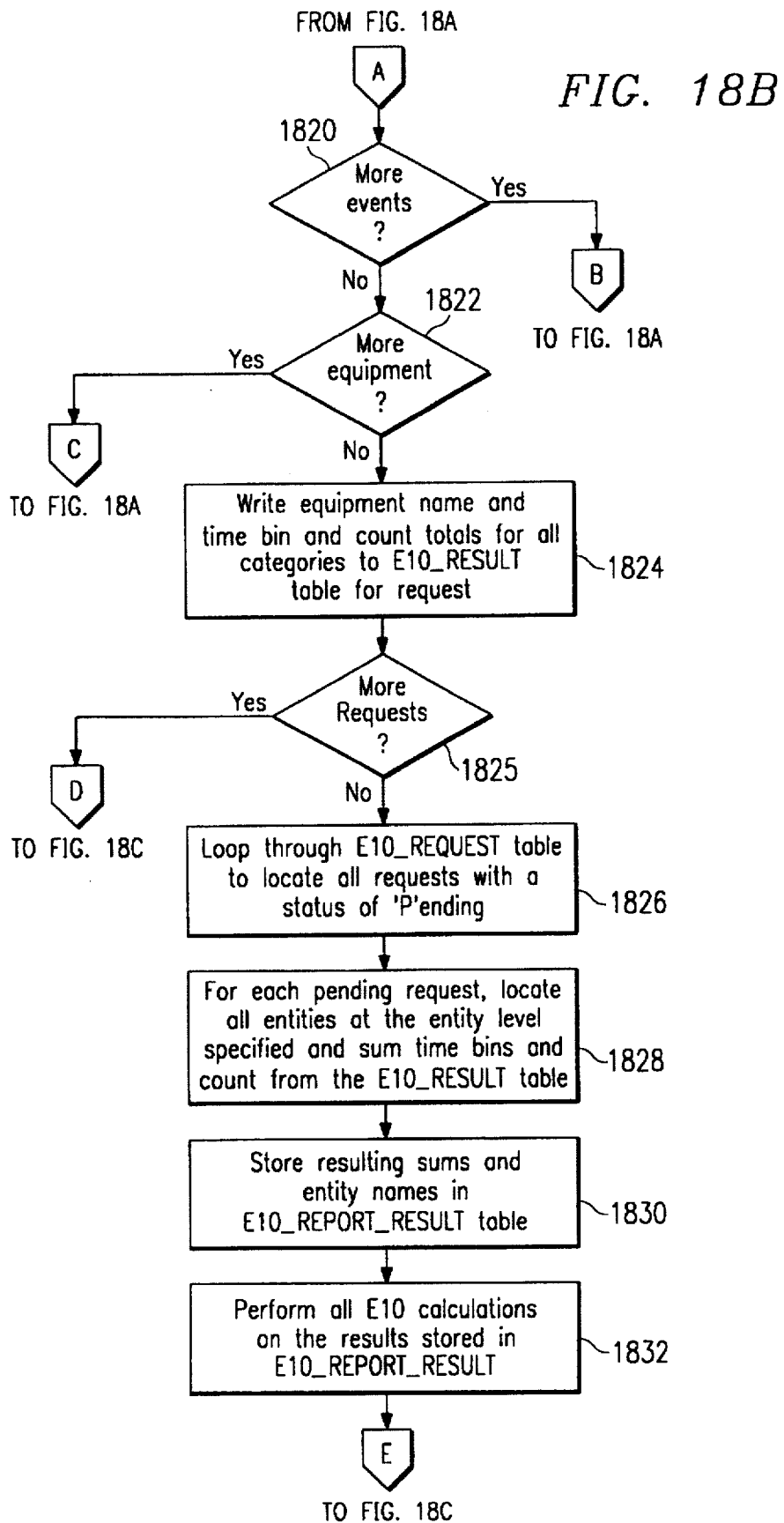
Figure 18C:
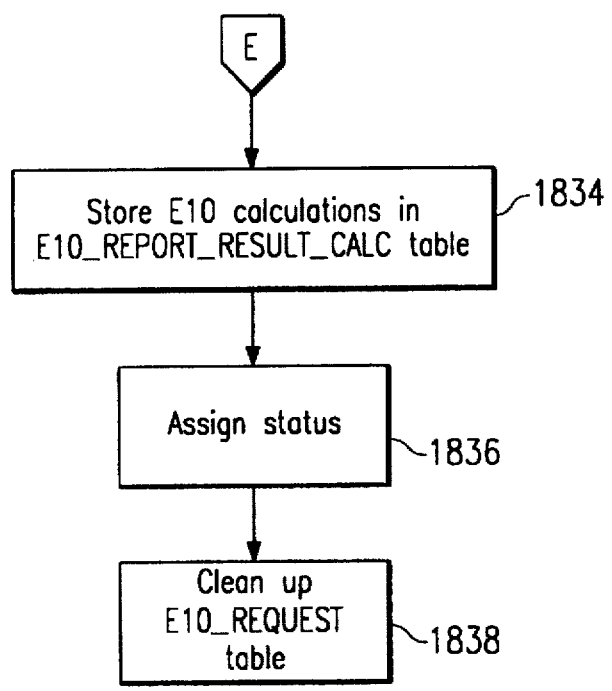

FIGS. 18A–18C illustrate a flowchart of the operation of a routine of the present invention for processing pending requests. In step 1800, the routine loops through the E10 _REQUEST table until a next request with a status of "'P'ending" is located. In step 1802, all of the equipment associated with the request located in step 1800 (hereinafter, the "current request") is identified and in step 1804, a list of the equipment identified in step 1802 is stored in an E10_ REQUEST_EQPT table. In step 1806, the routine loops through the E10_REQUEST_EQPT table to locate the next piece of equipment and, in step 1808, all events occurring within the time period of the request in connection with the equipment located in step 1806 (hereinafter the "current equipment") are identified and temporarily stored for processing.

In step 1809, the routine loops through the list of events identified in step 1808 to locate the next event. In step 1810, the event located in step 1809 (hereinafter, the "current event") is categorized by reference to a SEA_ CATEGORY_ATTRIBUTE table. In step 1811, the amount of time associated with the current event is calculated and then added to a time bin associated with the category of the current event determined in step 1810. In step 1812, a determination is made whether the current event has been categorized as a failure. If not, execution proceeds to step 1814, in which any counts associated with the event category, as specified in the SEA_CATEGORY_ ATTRIBUTE table, are incremented by one. If the event has been categorized as a failure, a determination is made in step 1816 whether the failure was a machine failure. If the failure was not a machine failure, i.e., it was a nonmachine failure, execution proceeds to step 1818, in which a nonmachine failure count is incremented by one, and then to step 1820. If in step 1816, it is determined that the failure was a machine failure, or upon completion of step 1814, execution proceeds directly to step 1820.

In step 1820, a determination is made whether there are more events in the list constructed in step 1808. If so, execution returns to step 1809, and the routine loops to find the next event in the list created in step 1806; otherwise, execution proceeds to step 1822. In step 1822, a determination is made whether there is more equipment in the E10_REQUEST_EQPT table If so, execution returns to step 1806; otherwise, execution proceeds to step 1824, in which the equipment name and time and count bin totals for all of the categories are written to an E10_RESULT table associated with the request. In step 1825, a determination is made whether there are more requests in the E10_ REQUEST table to be processed. If so, execution returns to step 1800; otherwise, execution proceeds to step 1826.

In step 1826, the routine again loops through the E10_ REQUEST table to locate all requests with a status of 'P'ending. In step 1828, for each pending request, the routine procedure finds all entities at the entity level specified for the request and sums the time and count bins from the E10_RESULT table for each entity. An entity may be a manufacturing area name, family, module, class, group, vendor or equipment. In step 1830, the resulting sums and entity name are stored in an E10 _REPORT_RESULT table. In step 1832, all E10 calculations are performed on the results stored in the E10 _REPORT_RESULT table and the value of each calculation is stored in an E10_REPORT_ RESULT_CALC table instep 1834. In step 1836, a report status is assigned to the report, which will be 'E'rror, if any error occurs in processing, or 'C'ompleted if no errors occur.

Finally, in step 1838, an the procedure "cleans up" the E10 _REQUEST table by deleting therefrom any record older than the number of days specified in an E10_ MAINTENANCE table. In this manner, the E10_ REQUEST table can be prevented from becoming saturated with obsolete requests.

In this manner, a user is able to generate any number of different E10 reports easily, automatically and accurately, simply by defining requests using the Submit E10 Request screen (FIG. 9) for each report to be submitted and then viewing and or printing selected COMPLETED reports using the Monitor/Report Request screen (FIG. 10).

It is understood that the present invention can take many forms and embodiments. The embodiments shown herein are intended to illustrate rather than to limit the invention, it being appreciated that variations may be made without departing from the spirit of the scope of the invention. For example, additional metrics, other than E10 metrics, could be calculated and different types of graphic reports could be generated, in addition, different execution and storage platforms could be used to implement the invention.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A method of automatically generating reports for use in assessing reliability, availability and performance of a plurality of pieces of equipment in a manufacturing environment, the method comprising:

accumulating in a database events occurring in connection with said equipment;

responsive to a data request having user selectable event restriction criteria, said event restriction criteria including a date range and a characteristic indicative of related ones of said pieces of equipment:

mapping each event complying with said event restriction criteria to one of a plurality of predefined equipment states and accumulating time associated with said event in one of a plurality of time bins, each time bin associated with one of said predefined equipment states;

accumulating numbers of equipment failures; and calculating a plurality of standard metrics using said numbers accumulated and said time accumulated in said time bins; and responsive to a report request identifying at least one of said calculated metrics and a report format, presenting said at least one of said calculated metrics in said identified report format for pieces of equipment indicated by said event restriction criteria.

2. The method of claim 1 wherein said identified format is a textual format or a graphical format.

3. The method of claim 1 wherein said presenting comprises displaying said at least one of said calculated metrics in said identified report format on a video terminal.

4. The method of claim 1 wherein said presenting comprises generating a hard copy of said at least one of said calculated metrics in said identified report format using a printer or plotter.

5. The method of claim 1, wherein said characteristic indicates a family of related equipment.

6. The method of claim 1, wherein said characteristic indicates a manufacturing site.

7. The method of claim 1, wherein said characteristic indicates a manufacturing area.

8. The method of claim 1, wherein said characteristic indicates a module.

9. The method of claim 1, wherein said mapping is responsive to a user selectable mapping directive.

10. The method of claim 9, wherein said events comprise WorkStream events.

11. The method of claim 10 wherein said mapping directive indicates usage of mappings of status line values to said predefined equipment states.

12. The method of claim 9 wherein said mapping directive indicates usage of user-specified mappings of events to said predefined equipment states.

13. The method of claim 1 wherein said predefined equipment states comprise E10 states.

14. The method of claim 10 wherein said mapping directive indicates usage of mappings of user-specified mappings of events to said predefined equipment states.

15. An apparatus for automatically generating reports for determining reliability, availability and performance of a plurality of pieces of equipment in a manufacturing environment, the apparatus comprising:

a database for accumulating events occurring in connection with said equipment;

a server comprising:

logic responsive to a data request having user selectable event restriction criteria, said event restriction criteria including a date range and a characteristic indicative of related ones of said pieces of equipment, said logic for mapping each event complying with said event restriction criteria to one of a plurality of E10 categories and accumulating time associated with said event in one of a plurality of time bins, each time bin associated with one of said E10 categories;

counters for accumulating numbers of failures; and logic for calculating a plurality of E10 metrics using said numbers accumulated in said counters and said time accumulated in said time bins; and a display for presenting user-selected ones of said calculated E10 metrics in a user-specified report format for pieces of equipment indicated by said event restriction criteria.

16. The apparatus of claim 15 wherein said user-specified report format is a textual format or a graphical format.

17. The apparatus of claim 15 further comprising a printer for generating a printout of said user-selected ones of said calculated E10 metrics.

18. The apparatus of claim 15 wherein said user-specified report format comprises a graph, the apparatus further comprising a plotter for generating a hard copy of said graph.

19. The apparatus of claim 15, wherein said mapping is responsive to a user selectable mapping directive.

20. The apparatus of claim 19, wherein said database comprises a manufacturing execution system database and said events comprise WorkStream events.

21. The apparatus of claim 20 wherein said mapping directive indicates usage of mappings of status line values to said E10 categories.

22. The apparatus of claim 19, wherein said mapping directive indicates usage of user-specified mappings of events to said E10 categories.

23. The apparatus of claim 20, wherein said mapping directive indicates usage of mappings of user-specified mappings of events to said E10 categories.

24. Apparatus for enabling the automatic generation of reports for indicating reliability, availability and performance of a plurality of pieces of equipment in a manufacturing environment, the apparatus comprising:

means for storing events occurring in connection with said equipment;

responsive to a data request having user selectable event restriction criteria, said event restriction criteria including a date range and a characteristic indicative of related ones of said pieces of equipment, means for mapping each event complying with said event restriction criteria to one of a plurality of predefined equipment states;

means for accumulating time associated with said event in one of a plurality of time bins, each time bin associated with one of said predefined equipment states;

means for accumulating numbers of equipment failures; and means for calculating a plurality of standard metrics using said numbers and said time accumulated in said time bins; and means responsive to a report request identifying at least one of said calculated metrics and a report format for presenting said at least one of said calculated metrics in said identified report format for pieces of equipment indicated by said event restriction criteria.

25. The apparatus of claim 24 wherein said identified format is a textual format or a graphical format.

26. The apparatus of claim 24 wherein said means for presenting comprises a video terminal.

27. The apparatus of claim 24 wherein said means for presenting comprises a printer or plotter.

28. The apparatus of claim 24, wherein said means for mapping is responsive to a user selectable mapping directive.

29. The apparatus of claim 28 wherein said means for storing comprises a manufacturing execution system database and said events comprise WorkStream events.

30. The apparatus of claim 29, wherein said mapping directive indicates usage of mappings of status line values to said predefined equipment states.

31. The apparatus of claim 28, wherein said mapping directive indicates usage of user-specified mappings of events to said predefined equipment states.

32. The apparatus of claim 29, wherein said mapping directive indicates usage of user-specified mappings of events to said predefined equipment states.

33. The apparatus of claim 24 wherein said predefined equipment states comprise E10 states.

* * * * *